(12) United States Patent
Kikuchi

(10) Patent No.: US 9,868,633 B2
(45) Date of Patent: Jan. 16, 2018

(54) PRODUCTION PROCESS FOR DEVICE

(71) Applicant: CANON KABUSHIKI KAISHA, Tokyo (JP)

(72) Inventor: Kazunori Kikuchi, Hiratsuka-shi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/083,995

(22) Filed: Mar. 29, 2016

(65) Prior Publication Data

US 2016/0304339 A1    Oct. 20, 2016

(30) Foreign Application Priority Data

Apr. 17, 2015   (JP) ................. 2015-084843

(51) Int. Cl.
  *H01L 21/00*   (2006.01)
  *B81C 1/00*    (2006.01)

(52) U.S. Cl.
  CPC ...... *B81C 1/00357* (2013.01); *B81B 2207/07* (2013.01)

(58) Field of Classification Search
  CPC ......... H01L 25/50; H01L 21/78; H01L 21/82; H01L 21/84; H01L 2924/15153; H01L 2924/16152; B81C 1/00269
  See application file for complete search history.

(56) References Cited

U.S. PATENT DOCUMENTS

| 2012/0228744 A1* | 9/2012 | Kawada | H03H 3/04 257/620 |
| 2015/0276512 A1* | 10/2015 | Zhang | G01L 9/0047 73/862.626 |
| 2015/0348868 A1* | 12/2015 | Lin | H01L 21/4803 257/714 |
| 2016/0159642 A1* | 6/2016 | Hooper | B81B 7/0061 257/419 |
| 2016/0285232 A1* | 9/2016 | Reinert | H01L 33/58 |

FOREIGN PATENT DOCUMENTS

| JP | 10-197907 A | 7/1998 |
| JP | 2007-248281 A | 9/2007 |

* cited by examiner

*Primary Examiner* — Selim Ahmed
*Assistant Examiner* — Evan Clinton
(74) *Attorney, Agent, or Firm* — Fitzpatrick, Cella, Harper & Scinto

(57) ABSTRACT

A production process for a device in which a first substrate and a second substrate are bonded to each other with bonding surfaces thereof mutually bonded and the second substrate has a through-hole, the production process including the steps of bonding the first substrate and the second substrate to each other with the presence of a non-bonding region formed by a recessed shape portion recessed from at least one of the bonding surface of the first substrate and the bonding surface of the second substrate; and causing at least a part of a portion of the second substrate corresponding to the non-bonding region to pass through.

19 Claims, 9 Drawing Sheets

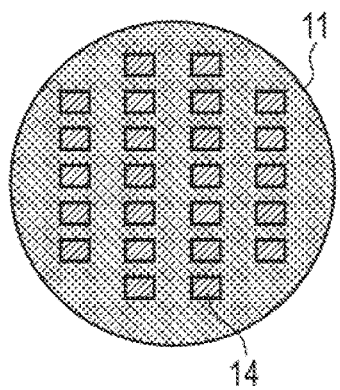
FIG. 1A1
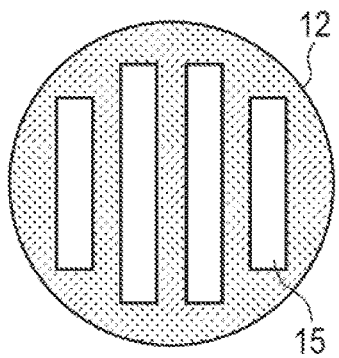
FIG. 1B1
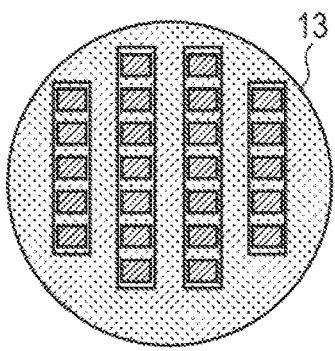
FIG. 1C1
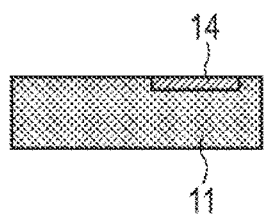
FIG. 1A2
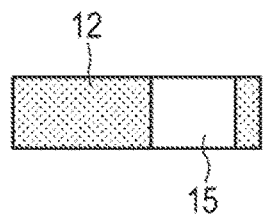
FIG. 1B2
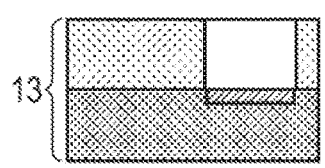
FIG. 1C2
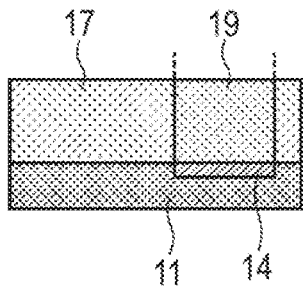
FIG. 2A
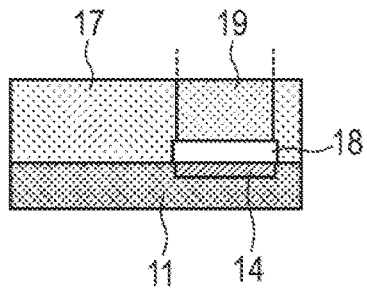
FIG. 2B

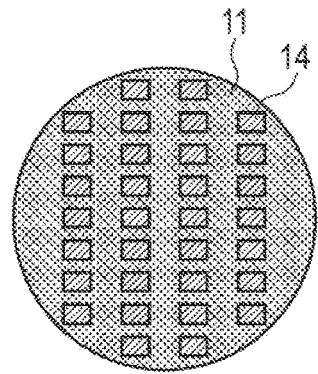
FIG. 3A1
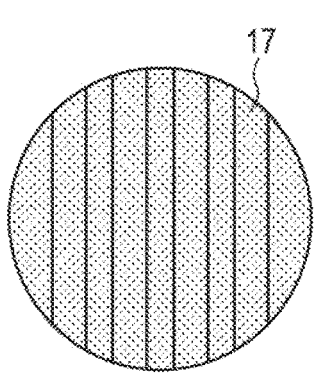
FIG. 3B1
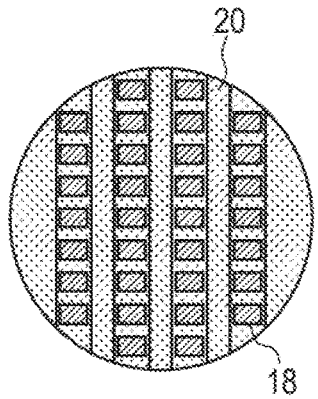
FIG. 3C1
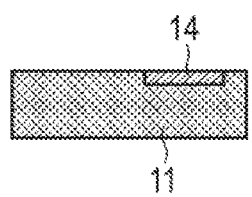
FIG. 3A2
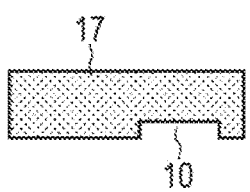
FIG. 3B2
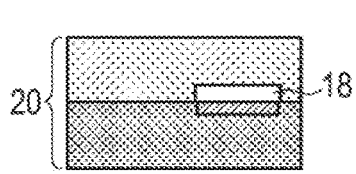
FIG. 3C2
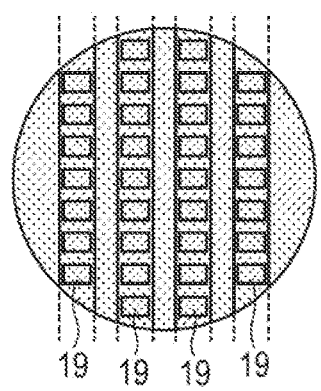
FIG. 3D1
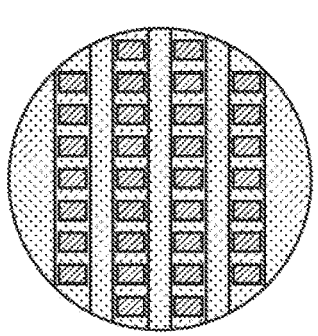
FIG. 3E1
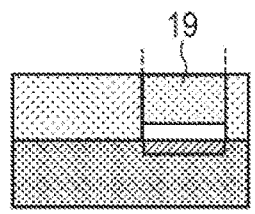
FIG. 3D2
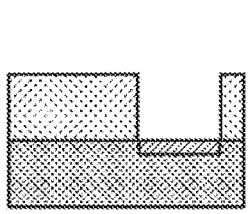
FIG. 3E2

PRODUCTION PROCESS FOR DEVICE

BACKGROUND OF THE INVENTION

Field of the Invention

The present invention relates to a production process for a device which includes a structure formed by bonding two substrates and which has an opening such as an electric wire lead-out portion.

Description of the Related Art

In recent years, mass production of MEMS such as pressure sensors and acceleration sensors and of functional devices such as microfluidic devices is made possible by arranging multiple structures on a substrate by using a semiconductor process and forming chips of such devices. The aforementioned structures are fabricated in many cases by using a method of bonding two substrates on at least one of which detection elements are arranged. In this case, an electrode PAD for connecting each of the detection elements to an external device needs to be exposed. As a method of exposing the electrode PAD, there are disclosed a method of bonding upper and lower substrates in an offset manner (Japanese Patent Application Laid-Open No. H10-197907) and a method of bonding an electrode substrate and a substrate to be a cover which has an opening (Japanese Patent Application Laid-Open No. 2007-248281).

Problems in the conventional techniques are described by using FIGS. 1A1 to 1C2. These drawings show that a substrate illustrated in FIGS. 1A1 and 1A2 and a substrate illustrated in FIGS. 1B1 and 1B2 are bonded to each other and structures are thereby obtained in a bonded substrate illustrated in FIGS. 1C1 and 1C2. Note that FIGS. 1A1, 1B1, and 1C1 are plan views illustrating steps of fabricating multiple structures on one substrate, and FIGS. 1A2, 1B2, and 1C2 are cross-sectional views illustrating steps of fabricating one of the structures (the same applies to FIGS. 3A1 to 3E2 described later). When such structures are MEMS or microfluidic devices which have electric wiring, an electrode PAD 14 is required to establish electrical connection between the electric wiring and an external device such as a power supply. When the electrode PAD 14 is arranged on a bonding surface of an electrode substrate 11 which is to be bonded to a substrate 12 to be a cover (FIGS. 1A1 and 1A2), an opening 15 needs to be formed in the substrate to be the cover to enable connection with the electrode PAD 14 (FIGS. 1B1 and 1B2). If the opening 15 is formed in a substrate end portion, the rigidity of the substrate 12 decreases and this may lead to substrate breakage in conveying and transporting the substrate. Accordingly, an area without any opening needs to be provided in the substrate end portion to maintain the rigidity, i.e. no functional device can be arranged in the substrate end portion. Accordingly, the conventional techniques have a problem that the number of chips which can be obtained from one substrate is limited and utilization efficiency of the substrate cannot be improved.

SUMMARY OF THE INVENTION

The present invention provides a production process for a device in which more devices can be arranged on one substrate, thereby enabling an increase in the number of chips obtained from one substrate and a reduction of cost for producing chips.

A production process for a device of the present invention for solving the problems described above is a production process for a device in which a first substrate and a second substrate are bonded to each other with bonding surfaces thereof mutually bonded and the second substrate has a through-hole, the production process including the steps of bonding the first substrate and the second substrate to each other with the presence of a non-bonding region formed by a recessed shape portion recessed from at least one of the bonding surface of the first substrate and the bonding surface of the second substrate; and causing at least a part of a portion of the second substrate corresponding to the non-bonding region to pass through.

According to the production process for the device of the present invention, there is no need to form an opening in the substrate to be the cover before the bonding, and the rigidity of the substrate is thereby secured. This solves the problem of the substrate being broken when the substrate is held, conveyed, or transferred. Moreover, since chips can be arranged even at a substrate end, it is possible to increase the number of chips which can be obtained from one substrate and to provide chips at a lower cost.

Further features of the present invention will become apparent from the following description of exemplary embodiments with reference to the attached drawings.

BRIEF DESCRIPTION OF THE DRAWINGS

FIGS. 1A1, 1A2, 1B1, 1B2, 1C1 and 1C2 are schematic views of conventional production steps.

FIGS. 2A and 2B are schematic views of a case where no non-bonding region is provided and a case where the non-bonding region is provided.

FIGS. 3A1, 3A2, 3B1, 3B2, 3C1, 3C2, 3D1, 3D2, 3E1 and 3E2 are schematic views of a production process of the present invention.

DESCRIPTION OF THE EMBODIMENTS

Figure 4A:
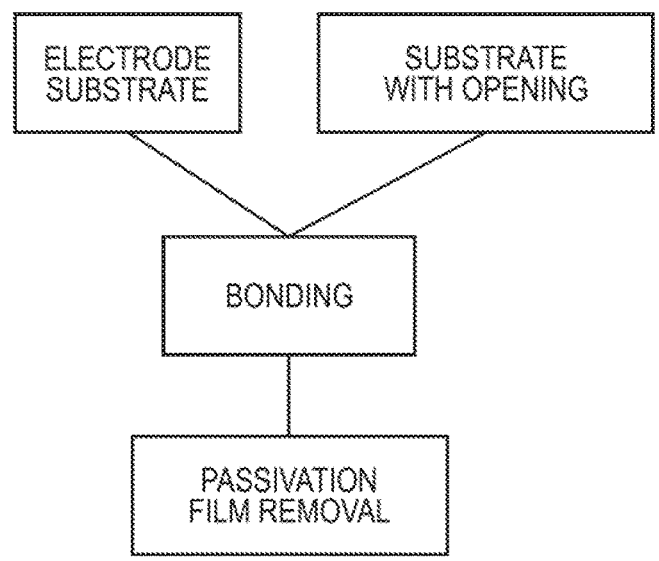
FIGS. 4A and 4B are process flows of steps in a conventional technique and steps in the present invention.

Preferred embodiments of the present invention will now be described in detail in accordance with the accompanying drawings.

A production process for a device in the present invention is a production process for a device in which a first substrate and a second substrate are bonded to each other with bonding surfaces thereof mutually bonded and the second substrate has a through-hole, the production process including the steps of bonding the first substrate and the second substrate to each other with the presence of a non-bonding region formed by a recessed shape portion recessed from at least one of the bonding surface of the first substrate and the bonding surface of the second substrate; and causing at least a part of a portion of the second substrate corresponding the non-bonding region to pass through.

In a production process in an embodiment of the present invention, a recessed portion is formed in a part of two substrates to provide a non-bonding region between the substrates after bonding. After the bonding, that portion corresponding to the non-bonding region of the substrate which faces an electrode PAD is removed to expose an electrode PAD portion. FIG. 2A is a schematic view of a case where no non-bonding region is provided, and FIG. 2B is a schematic view of a case where a non-bonding region is provided. In the case where no non-bonding region 18 is provided (FIG. 2A), an electrode portion 14 and an unnecessary portion 19 to be removed after the bonding are bonded to each other, and the unnecessary portion 19 cannot be removed. In the case where the non-bonding region 18 is provided (FIG. 2B), since the non-bonding region 18 is present between the electrode portion 14 and the unnecessary portion 19 to be removed after the bonding, the electrode portion 14 and the unnecessary portion 19 are not bonded to each other. Accordingly, it is possible to remove the unnecessary portion 19 by machining to form an opening.

In the configuration of the present invention described above, there is no need to form an opening in a substrate to be a cover before the bonding, and the rigidity of the substrate is thereby secured. This solves the problem of the substrate being broken when the substrate is held, conveyed, or transferred, and allows chips to be arranged even at a substrate end, thereby increasing the number of chips which can be obtained from the substrate.

FIGS. 3A1 to 3E2 are schematic views of steps in the present invention. Multiple electrode PADS 14 are arranged as structures on a bonding surface of an electrode substrate 11 (first substrate) (FIGS. 3A1 and 3A2), and a recessed shape portion 10 to be the non-bonding region 18 is formed in a portion on a bonding surface of a substrate 17 (second substrate) to be a cover, the portion corresponding to a through-hole to be formed later (FIGS. 3B1 and 3B2).

The material of the electrode substrate 11 and the substrate 17 to be the cover is selected from materials which have resistance to temperature at which the device is used and to samples and chemicals used in the device and have no contamination effects and which are suitable for usage conditions such as optical characteristics. For example, when used at high temperature, the material of the electrode substrate 11 and the substrate 17 can be selected from materials such as glass, silicon, and metal. When corrosion resistance, alkali resistance, and acid resistance need to be secured, the material of the electrode substrate and the substrate 17 is preferably selected from glass and silicon. Moreover, when the temperature is not high, a resin material can be selected.

A material with low specific resistance is used as the material of the electrode PAD 14, and, for example, metal such as gold or aluminum is used.

The electrode substrate 11 and the substrate 17 to be the cover are bonded to each other with the presence of the non-bonding region 18 formed by the recessed shape portion 10, and the bonded substrate 20 is thereby formed (FIGS. 3C1 and 3C2). Thermal bonding, room temperature bonding, anode bonding, or the like is used as a bonding method, depending on the substrate material. In FIGS. 3A1 to 3E2, the recessed shape portion 10 is formed in the substrate 17 to be the cover. However, the recessed shape portion recessed from the bonding surface may be formed in one of the electrode substrate 11 and the substrate 17 to be the cover or in both substrates to form the non-bonding region 18 between the electrode PAD 14 and the substrate 17 to be the cover. The recessed shape portion can be formed by using dry etching, wet etching, or machining methods such as dicing, laser machining, milling, or blasting, and the formation method is not limited to these methods. An upper portion corresponding to the non-bonding region 18 is the unnecessary portion 19 which needs to be removed to expose the electrode (FIGS. 3D1 and 3D2).

Next, an electrode opening is formed by machining the substrate 17 to be the cover and thereby removing the unnecessary portion 19, and thus at least a part of a portion corresponding to the non-bonding region 18 is caused to pass through (FIGS. 3E1 and 3E2). A machining method such as dicing, laser machining, milling, or blasting is used for the machining of the unnecessary portion 19. Alternatively, the removal can be performed by using a method such as dry etching, wet etching, or ion milling, depending on the material of the substrate 17 to be the cover. Multiple devices each having a configuration in which the structure (electrode PAD 14) is open to the outside are thus formed in the bonded substrate 20 in which the electrode openings are formed as described above, and the bonded substrate 20 can be cut and divided into multiple chips by being subjected to dicing or laser machining.

Figure 4B:
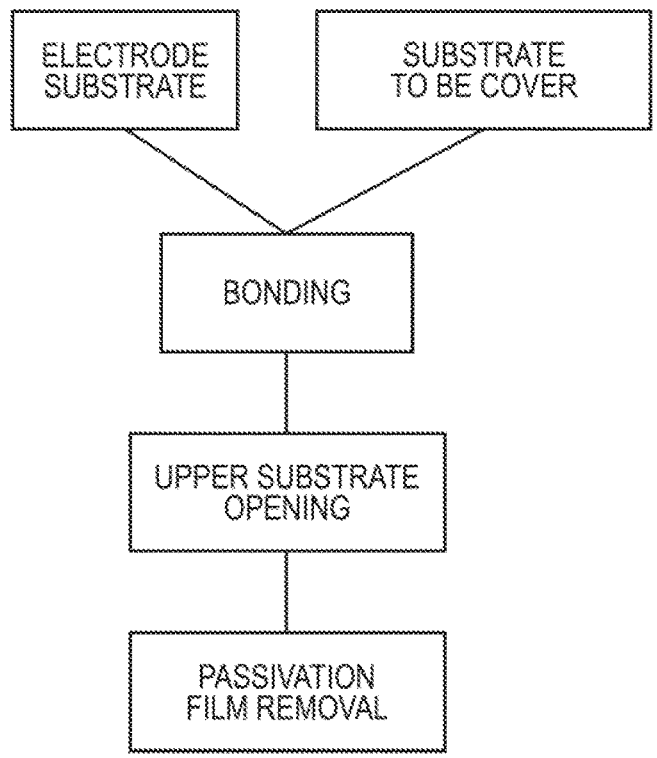

FIG. 4A illustrates a conventional production process flow, and FIG. 4B illustrates a production process flow of the present invention. In the conventional process, a substrate in which an opening is formed prior to bonding of substrates is attached to an electrode substrate, and a device is thereby formed. However, the present invention is characterized in that the machining for forming the opening for the required portion is performed after the bonding of the substrates. Although the embodiment is described by giving the example in which the opening for the electrode PAD portion is formed for external electrical connection, the purpose of forming the opening is not limited to this. The method described herein can expose a part of the bonded substrate by forming an opening, and is effective also for such a structure as a MEMS device in which mechanical access from the outside is necessary and for a structure in which optical access is necessary for observation from the outside, and the like Example 1

An example of a microfluidic device is given below to describe the present invention more specifically. Schematic views of Example 1 are illustrated in FIGS. 5A to 5F.

Electrode Substrate

Figure 5A:
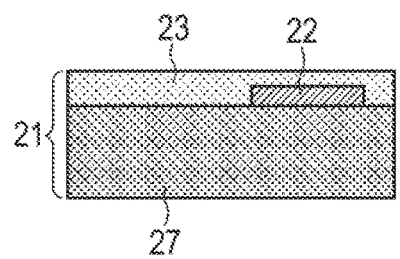
FIGS. 5A, 5B, 5C, 5D, 5E and 5F are schematic views of Example 1.

A substrate in which an electrode 22 and a $SiO_2$ passivation film 23 are formed on a synthetic quartz substrate 27 with a thickness of 0.7 mm is used as an electrode substrate 21 (FIG. 5A).

Substrate to be Cover

Figure 5B:
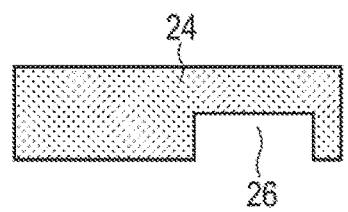

A synthetic quartz substrate with a thickness of 0.7 mm is used as a substrate 24 to be a cover. A recessed shape portion 26 to be a non-bonding region 25 is formed in a portion where an electrode opening is to be formed after bonding, to have a depth of 20 μm (FIG. 5B). In the case of forming a flow channel in the substrate 24 to be the cover, the flow channel and the non-bonding region 25 can be formed simultaneously.

Bonding of Substrates

Figure 5C:
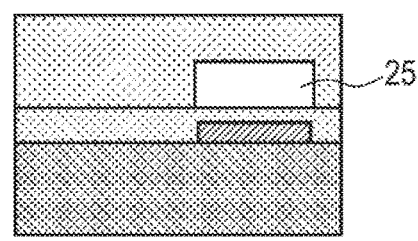
Figure 5D:
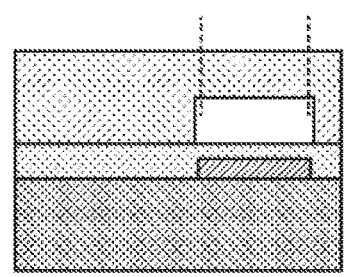

Bonding surfaces of the electrode substrate 21 and the substrate 24 to be the cover are activated by an ion gun in vacuum, and the electrode substrate 21 and the substrate 24 to be the cover are bonded to each other by applying pressure thereto while being aligned such that the electrode 22 and the non-bonding region 25 overlap with each other (FIG. 5C).

Machining of Opening

Figure 5E:
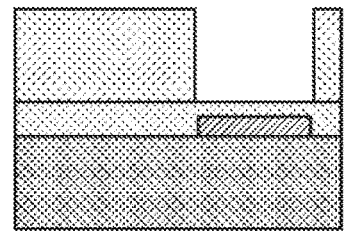

The substrate 24 to be the cover on the non-bonding region 25 is removed by dicing to form a through-hole in the substrate 24 with a cut depth of a dicing blade adjusted to such a height that the dicing blade reaches the non-bonding region 25 but does not reach the passivation film 23 (FIG. 5D), and an opening is thereby formed (FIG. 5E).

Passivation Film Removal

Figure 5F:
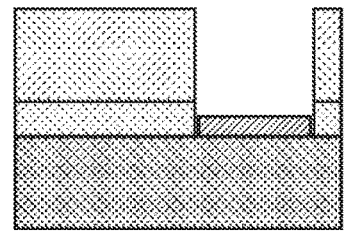

The passivation film 23 is removed by dry etching to expose the electrode 22 covered with the passivation film 23 (FIG. 5F).

Figure 6:
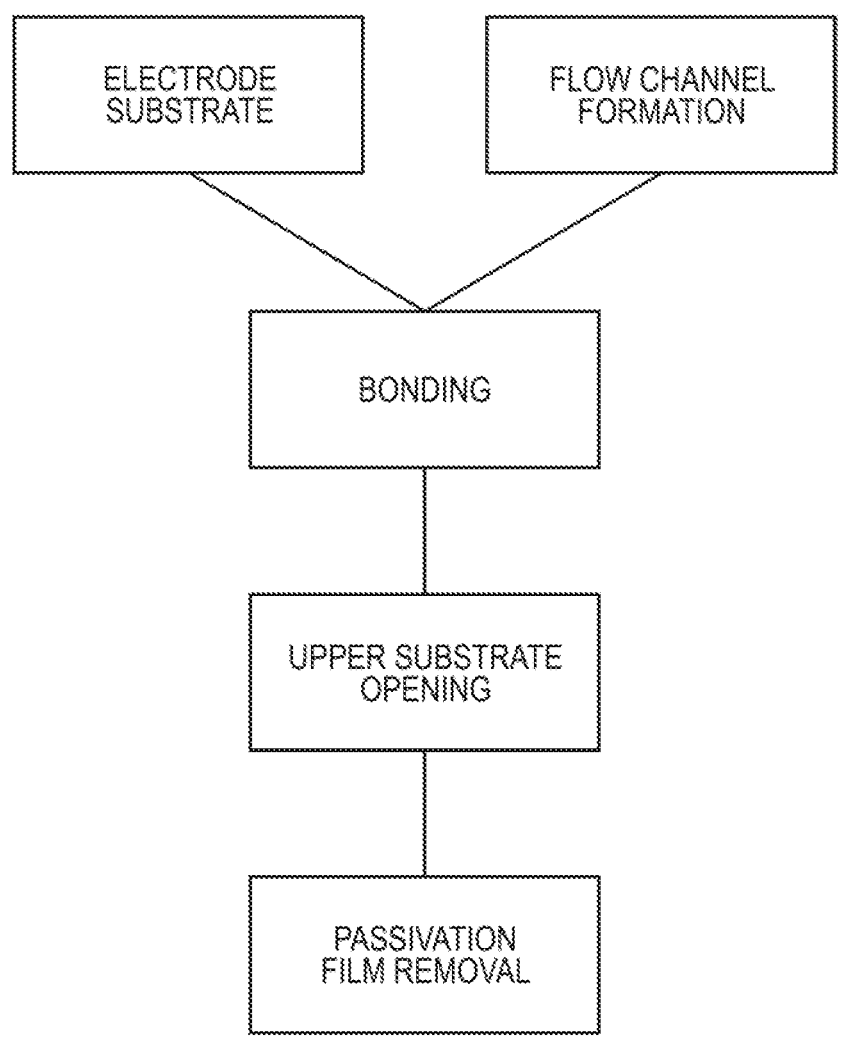
FIG. 6 is a process flow of Example 1.

FIG. 6 illustrates a flow in Example 1.

Example 1 is an example in which the non-bonding region 25 is provided in the substrate 24 to be the cover.

Example 2

Example 2 is described below. FIGS. 7A to 7E are schematic views of Example 2.

Electrode Substrate

Figure 7A:
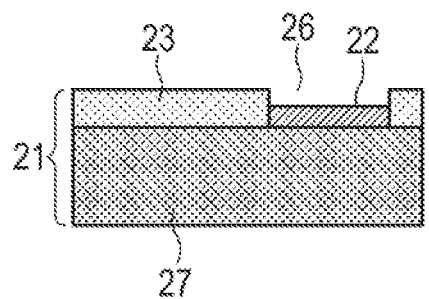
FIGS. 7A, 7B, 7C, 7D and 7E are schematic views of Example 2.

A substrate in which a gold electrode 22 and a $SiO_2$ passivation film 23 are formed on a synthetic quartz substrate 27 with a thickness of 0.7 mm is used as an electrode substrate 21. A recessed shape portion 26 is formed before bonding by removing the passivation film 23 on the gold electrode 22 by dry etching (FIG. 7A). A portion where the passivation film 23 is removed serves as the non-bonding region 25 after the bonding. As illustrated in FIGS. 7A to 7E, the gold electrode 22 is formed in the electrode substrate 21 to be recessed from a bonding surface (on the side of the passivation film 23).

Substrate to be Cover

Figure 7B:
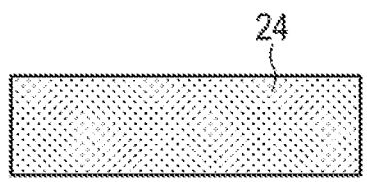

A synthetic quartz substrate with a thickness of 0.7 mm is used as a substrate 24 to be a cover (FIG. 7B). In the case of forming a flow channel in the substrate 24 to be the cover, only the flow channel is formed.

Bonding of Substrates

Figure 7C:
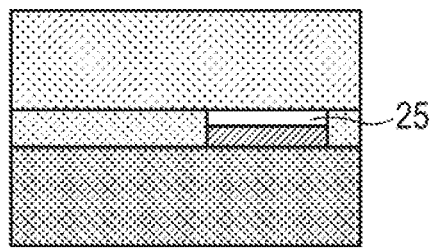
Figure 7D:
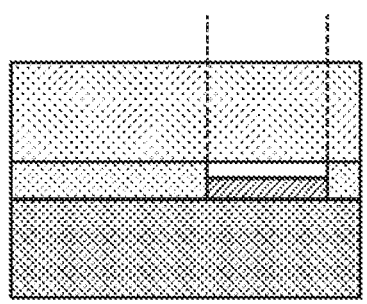

The electrode substrate 21 and the substrate 24 to be the cover are activated by an ion gun and are bonded to each other as in Example 1 (FIG. 7C).

Machining of Opening

Figure 7E:
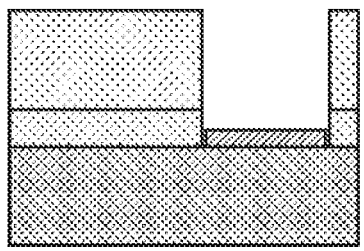

A portion of the substrate 24 to be the cover above the non-bonding region 25 is removed by dicing to form a through-hole in the substrate 24 with a cut depth of a dicing blade adjusted to such a height that the dicing blade reaches the non-bonding region 25 but does not reach the gold electrode 22 (FIG. 7D), and an opening is thereby formed (FIG. 7E).

Figure 8:
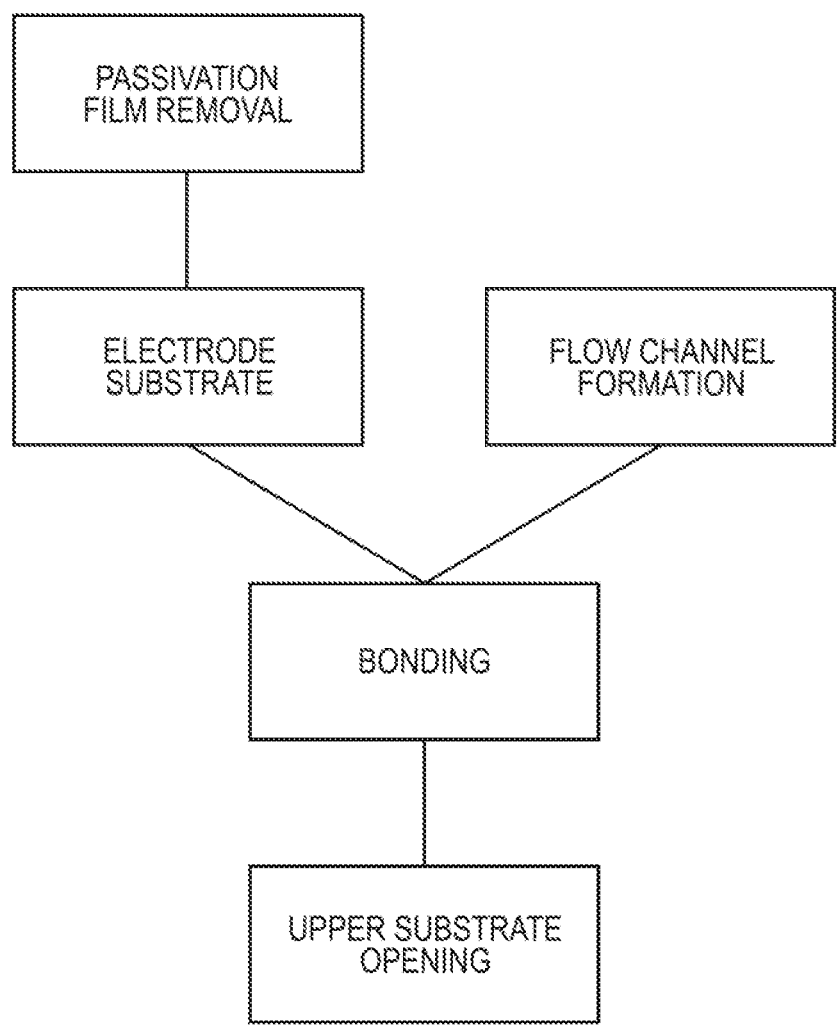
FIG. 8 is a process flow of Example 2.

FIG. 8 illustrates a flowchart of Example 2. Example 2 is an example in which the non-bonding region 25 is provided by removing the passivation film 23 of the electrode substrate 21.

Example 3

Example 3 is described below. FIGS. 9A to 9E are schematic views of Example 3.

Electrode Substrate

Figure 9A:
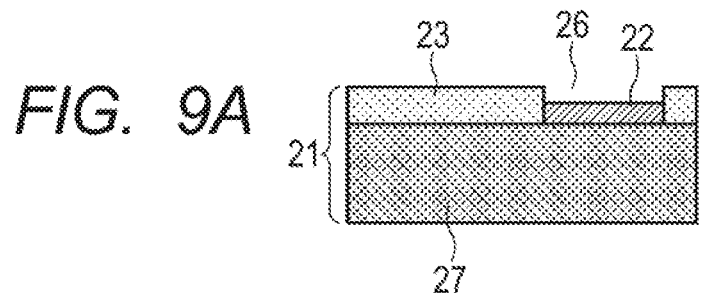
FIGS. 9A, 9B, 9C, 9D and 9E are schematic views of Example 3.

A substrate in which a gold electrode 22 and a $SiO_2$ passivation film 23 are formed on a synthetic quartz substrate 27 with a thickness of 0.7 mm is used as an electrode substrate 21. A recessed shape portion 26 is formed by removing the passivation film 23 on the gold electrode 22 by dry etching (FIG. 9A). A portion where the passivation film 23 is removed serves as the non-bonding region 25 after the bonding. As illustrated in FIGS. 9A to 9E, the gold electrode 22 is formed in the electrode substrate 21 to be recessed from a bonding surface (on the side of the passivation film 23).

Substrate to be Cover

Figure 9B:
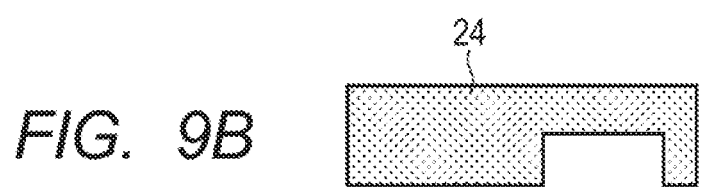

A synthetic quartz substrate with a thickness of 0.7 mm is used as a substrate 24 to be a cover. A recessed shape portion 26 to be the non-bonding region 25 is formed in a portion where an electrode opening is to be formed after the bonding (FIG. 9B). In the case of forming a flow channel in the substrate 24 to be the cover, the flow channel and the non-bonding region 25 can be formed simultaneously.

Bonding of Substrates

Figure 9C:
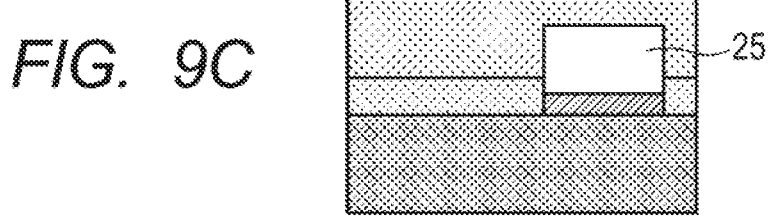
Figure 9D:
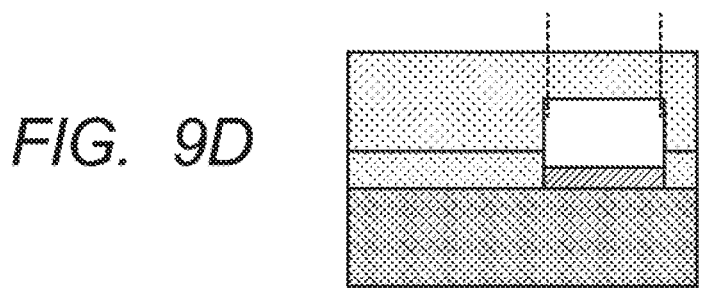

The electrode substrate 21 and the substrate 24 to be the cover are activated by an ion gun and are bonded to each other. In this case, the electrode substrate 21 and the substrate 24 to be the cover are bonded to each other while being aligned such that an electrode 22 and the non-bonding region 25 overlap with each other (FIG. 9C).

Machining of Opening

Figure 9E:
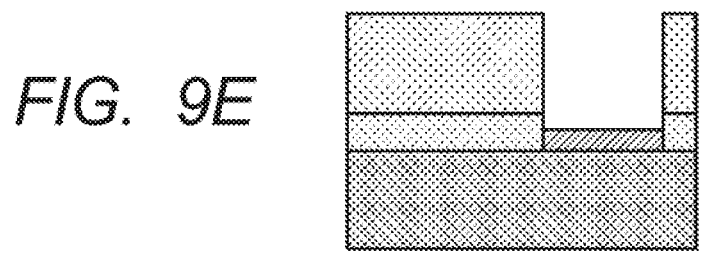

An unnecessary portion of the substrate 24 to be the cover above the non-bonding region 25 is removed by dicing to form a through-hole in the substrate 24 with a cut depth of a dicing blade adjusted to such a height that the dicing blade reaches the non-bonding region 25 but does not reach the gold electrode 22 (FIG. 9D), and an opening is thereby formed (FIG. 9E).

Figure 10:
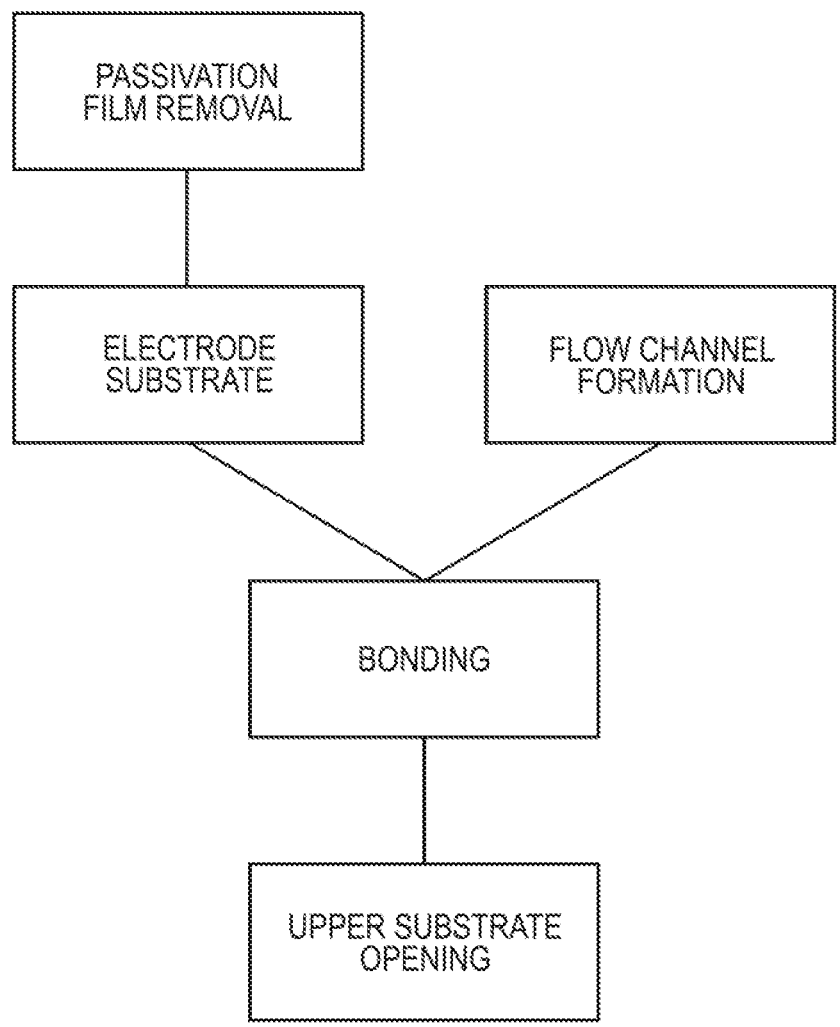
FIG. 10 is a process flow of Example 3.

FIG. 10 illustrates a flowchart of Example 3. Example 3 is an example in which the non-bonding region 25 is provided in both of the electrode substrate 21 and the substrate 24 to be the cover.

The present invention relates to a method of forming multiple structures which are arranged on a substrate in a device formed by bonding two substrates and which are used for electrical connection with the outside, mechanical connection with the outside, or optical connection, and can be utilized in production of MEMS, microfluidic devices, and electronic parts.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-084843, filed Apr. 17, 2015, which is hereby incorporated by reference herein in its entirety.

What is claimed is:

1. A production process for a device in which a first substrate and a second substrate are bonded to each other with bonding surfaces thereof mutually bonded and which includes an electrode PAD on the first substrate, the production process comprising:

bonding the first substrate and the second substrate to each other such that a non-bonding region is formed by a recessed shape portion recessed from at least one of the bonding surface of the first substrate and the bonding surface of the second substrate, and the electrode PAD is arranged in the non-bonding region; and removing, after the bonding of the first substrate and the second substrate, all parts of a portion of the second substrate corresponding to the non-bonding region so as to expose the electrode PAD on the first substrate.

2. The production process for the device according to claim 1, further comprising forming the recessed shape portion on the bonding surface of the first substrate.

3. The production process for the device according to claim 1, further comprising forming the recessed shape portion on the bonding surface of the second substrate.

4. A production process for a device in which a first substrate and a second substrate are bonded to each other with bonding surfaces thereof mutually bonded, the production process comprising:

bonding the first substrate and the second substrate to each other such that a non-bonding region is formed by a recessed shape portion recessed from at least one of the bonding surface of the first substrate and the bonding surface of the second substrate; and removing, after the bonding of the first substrate and the second substrate, at least a part of a portion of the second substrate corresponding to the non-bonding region so as to form an opening that passes through the second substrate, wherein the recessed shape portion is formed on the bonding surfaces of both of the first substrate and the second substrate.

5. The production process for the device according to claim 1, wherein:

a plurality of devices are formed in a bonded substrate obtained by bonding the first substrate and the second substrate to each other, and the process comprises cutting and dividing the bonded substrate into a plurality of chips of the devices, after the removing of the at least the part of the portion of the second substrate.

6. The production process for the device according to claim 1, wherein:

a structure is formed on a surface of the first substrate, in the bonding of the first substrate and the second substrate, the first substrate and the second substrate overlap each other such that at least a surface of the structure and the second substrate do not come into contact with each other, and in the removing of the at least the part of the portion of the second substrate, the surface of the structure is exposed via the opening.

7. The production process for the device according to claim 1, wherein the second substrate has another recess, which forms a flow channel.

8. A production process for a device in which a first substrate and a second substrate are bonded to each other with bonding surfaces thereof mutually bonded, the production process comprising:

bonding the first substrate and the second substrate to each other such that a non-bonding region is formed by a recessed shape portion recessed from at least one of the bonding surface of the first substrate and the bonding surface of the second substrate; and removing by dicing, after the bonding of the first substrate and the second substrate, at least a part of a portion of the second substrate corresponding to the non-bonding region so as to expose the surface of the first substrate.

9. The production process for the device according to claim 8, further comprising forming the recessed shape portion on the bonding surface of the first substrate.

10. The production process for the device according to claim 8, further comprising forming the recessed shape portion on the bonding surface of the second substrate.

11. The production process for the device according to claim 8, wherein:

a plurality of devices are formed in a bonded substrate obtained by bonding the first substrate and the second substrate to each other, and the process comprises cutting and dividing the bonded substrate into a plurality of chips of the devices, after the removing of the at least the part of the portion of the second substrate.

12. The production process for the device according to claim 8, wherein:

a structure is formed on a surface of the first substrate, in the bonding of the first substrate and the second substrate, the first substrate and the second substrate overlap each other such that at least a surface of the structure and the second substrate do not come into contact with each other, and in the removing of the at least the part of the portion of the second substrate, the surface of the structure is exposed via the opening.

13. The production process for the device according to claim 8, wherein the removing is conducted for all parts of the portion of the second substrate corresponding to the non-bonding region.

14. The production process for the device according to claim 8, wherein the second substrate has another recess, which forms a flow channel.

15. A production process for a device in which a first substrate and a second substrate are bonded to each other with bonding surfaces thereof mutually bonded and which includes an electrode PAD on the first substrate, the production process comprising:

bonding the first substrate and the second substrate to each other such that a non-bonding region is formed by a recessed shape portion recessed from at least one of the bonding surface of the first substrate and the bonding surface of the second substrate, and the electrode PAD is arranged in the non-bonding region; and removing, after the bonding of the first substrate and the second substrate, at least a part of a portion of the second substrate corresponding to the non-bonding region so as to expose the electrode PAD on the first substrate, wherein the second substrate has another recess, which forms a flow channel.

16. The production process for the device according to claim 15, further comprising forming the recessed shape portion on the bonding surface of the first substrate.

17. The production process for the device according to claim 15, further comprising forming the recessed shape portion on the bonding surface of the second substrate.

18. The production process for the device according to claim 15, wherein:

a plurality of devices are formed in a bonded substrate obtained by bonding the first substrate and the second substrate to each other, and the process comprises cutting and dividing the bonded substrate into a plurality of chips of the devices, after the removing of the at least the part of the portion of the second substrate.

19. The production process for the device according to claim 15, wherein:

a structure is formed on a surface of the first substrate, in the bonding of the first substrate and the second substrate, the first substrate and the second substrate overlap each other such that at least a surface of the structure and the second substrate do not come into contact with each other, and in the removing of the at least the part of the portion of the second substrate, the surface of the structure is exposed via the opening.

* * * * *